US008559191B2

(12) United States Patent
Porter et al.

(10) Patent No.: US 8,559,191 B2
(45) Date of Patent: Oct. 15, 2013

(54) MULTI-PURPOSE MOUNTING DEVICES FOR MOUNTING ELECTRICAL PACKAGES TO AIRBORNE OBJECTS

(75) Inventors: James L. Porter, Tucson, AZ (US); Matthew Glenn Murphy, Tucson, AZ (US); Jesse H. Blake, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 887 days.

(21) Appl. No.: 12/643,390

(22) Filed: Dec. 21, 2009

(65) Prior Publication Data

US 2011/0026237 A1 Feb. 3, 2011

Related U.S. Application Data

(60) Provisional application No. 61/142,549, filed on Jan. 5, 2009.

(51) Int. Cl.

*H05K 7/02* (2006.01)
*H05K 7/16* (2006.01)
*H02B 1/01* (2006.01)
*H01Q 1/28* (2006.01)

(52) U.S. Cl.

USPC ........... 361/807; 361/727; 361/809; 361/810; 361/825; 343/705

(58) Field of Classification Search

USPC ......................... 343/705, 708, 713, 878, 887; 455/575.4; 361/727, 807, 809, 810, 361/825

See application file for complete search history.

(56) References Cited

U.S. PATENT DOCUMENTS

| | | | | |
|---|---|---|---|---|
| 3,710,338 | A | 1/1973 | Munson | |
| 4,882,970 | A * | 11/1989 | Kovar | 89/1.55 |
| 5,929,816 | A | 7/1999 | Gross et al. | |
| 6,191,750 | B1 * | 2/2001 | Bonebright | 343/767 |
| 6,407,709 | B1 * | 6/2002 | Hanshew | 343/702 |
| 6,407,711 | B1 | 6/2002 | Bonebright et al. | |
| 6,618,017 | B1 * | 9/2003 | Ryken et al. | 343/705 |
| 6,977,618 | B1 * | 12/2005 | Hanewinkel et al. | 343/705 |
| 7,296,520 | B1 | 11/2007 | McMullen, Jr. | |
| 2010/0277379 | A1 | 11/2010 | Lindackers et al. | |

FOREIGN PATENT DOCUMENTS

DE 2300631 A1 7/1974

OTHER PUBLICATIONS

Berns, K. L. and Kaloi, C. M. "Wrap-Around Telemeter," Navy Technical Disclosure Bulletin, Office of Naval Research, Arlington, US, vol. 6, No. 1, Jan. 1, 1981, pp. 43-47, XP002124420.

European Patent Office, International Searching Authority, "International Search Report," mailed Oct. 7, 2010; International Application No. PCT/US2009/069655, filed Dec. 29, 2009.

* cited by examiner

*Primary Examiner* — Timothy Thompson
*Assistant Examiner* — Sherman Ng
(74) *Attorney, Agent, or Firm* — Thorpe North & Western LLP

(57) ABSTRACT

Embodiments of a multi-purpose mounting device for mounting an electrical device to a structure coupled to an airborne object are provided. In one embodiment, the multi-purpose mounting device includes an adapter member and a slide member coupled to the adapter member. The slide member is radially spaced apart from the adapter member to form an open slot, which is configured to receive a portion of the external structural therein to secure the multi-purpose mounting device to the airborne object. A first mounting surface is provided on one of the adapter member and the slide member and configured to support the electrical device.

19 Claims, 3 Drawing Sheets

MULTI-PURPOSE MOUNTING DEVICES FOR MOUNTING ELECTRICAL PACKAGES TO AIRBORNE OBJECTS

CROSS-REFERENCES TO RELATED APPLICATIONS

This application claims priority to U.S. Provisional Application Ser. No. 61/142,549, filed Jan. 5, 2009, the entire contents of which are hereby incorporated by reference.

TECHNICAL FIELD

The present invention relates generally to the retrofitting of airborne objects and, more particularly, to embodiments of a multi-purpose mounting device suitable for securing one or more electrical devices to a laser guided bomb or other airborne munition.

BACKGROUND

As a result of extensive engineering efforts, the guidance capabilities of laser guided bombs and other airborne munitions have improved considerably in recent years. Advanced precision guidance munitions now employ multiple onboard guidance systems to increase accuracy, minimize collateral damage, and improve overall munition effectiveness. As one example, the Raytheon Company, currently headquartered in Waltham, Mass., has introduced the Enhanced Paveway™ family of precision guided bombs that incorporate dual mode global position system-enhanced inertial navigation guidance systems (GPS/INS) with laser-guidance packages. While the advantages of precision guided munitions over conventional non-guided or "dumb" munitions have been well demonstrated through field testing and in combat scenarios, it is cost prohibitive and generally impractical to replace the numerous non-guided munitions currently in existence with their precision guided counterparts. A demand has thus developed for a low cost and reliable manner in which to provide a pre-existing non-guided munition with precision guidance capabilities. To satisfy this demand, precision guidance kits (PGKs) have been developed that can be retrofitted to a non-guided munition and provide precision guidance, datalink, telemetry, and aircraft interface functionalities thereto.

In equipping a non-guided munition with a PGK, it is often desirable to mount one or more electrical devices on the munition. For example, it may be desirable to mount an antenna or transmitter to the exterior of an airborne munition, or a battery, processor, or the like to the interior of the airborne munition. It may also be desirable to mount various sensors (e.g., airspeed sensors, altitude sensors, g-force sensors, etc.) to either the exterior and/or the interior of the airborne munition. Conventional techniques for mounting electrical devices to airborne munitions have typically entailed substantial modifications to the munition. Holes are often drilled in the munition casing to enable the attachment of specialized hardware. Wires or cables utilized to interconnect electrical components are typically taped onto the munition skin or routed through specialized conduits. Such modifications are time consuming, costly, and may require technical inspection or weapon requalification to ensure the satisfaction of quality standards. Although adhesives have been suggested as a more straightforward and less costly means for mounting an antenna or other electrical device to an airborne munition, even the strongest adhesives are generally unable to withstand the significant loading forces, temperature variations, supersonic airflows, vibratory forces, and other harsh conditions experienced during flight of military aircraft.

There thus exists an ongoing need to provide embodiments of a removable mounting device for securely mounting one or more electrical components (e.g., an antenna, a sensor package, etc.) to the exterior and/or interior of an airborne munition or other airborne object. Ideally, such a mounting device would be field installable, all-weather capable, and relatively insensitive to temperature variation; would have a low profile to minimize drag when subjected to high velocity airflow; would be relatively lightweight; would be relatively rugged to withstand extreme loading conditions, high vibratory forces, bird strikes, and soldier handling; would be scalable to munitions of different sizes; would be generally incapable of disengaging from the airborne munition, after installation thereon, to prevent in-flight damage of the aircraft; and would enable the routing of wires, cables, or other electrical connectors between electrical components in a protected and low strain manner. At the same time, it is desirable for such a mounting device to be amenable to low cost manufacture. Other desirable features and characteristics of the present invention will become apparent from the subsequent Detailed Description and the appended Claims, taken in conjunction with the accompanying Drawings and this Background.

BRIEF SUMMARY

Embodiments of a multi-purpose mounting device are provided for mounting an electrical device to a structure coupled to an airborne object. In one embodiment, the multi-purpose mounting device includes an adapter member and a slide member coupled to the adapter member. The slide member is radially spaced apart from the adapter member to form an open slot, which is configured to receive a portion of the external structural therein to secure the multi-purpose mounting device to the airborne object. A first mounting surface is provided on one of the adapter member and the slide member and configured to support the electrical device.

Embodiments of a method are also provided for retrofitting an electrical device to an airborne object having a conical housing section. In one embodiment, the method includes the steps of disposing a generally cylindrical faring around the conical housing section to form an annular clearance between the conical housing section and the faring, securing a multi-purpose mounting device having a mounting surface within the annular clearance, and attaching the electrical device to the mounting surface.

BRIEF DESCRIPTION OF THE DRAWINGS

At least one example of the present invention will hereinafter be described in conjunction with the following figures, wherein like numerals denote like elements, and.

DETAILED DESCRIPTION

The following Detailed Description is merely exemplary in nature and is not intended to limit the invention or the application and uses of the invention. Furthermore, there is no intention to be bound by any theory presented in the preceding Background or the following Detailed Description. The following Detailed Description describes an exemplary embodiment of a multi-purpose mounting device in the context of a particular type of airborne object, namely, a laser guided bomb. It is, however, emphasized that embodiments of the multi-purpose mounting device can be utilized in conjunction with a wide variety of airborne objects including, but not limited to, other types of airborne munition (e.g., missiles and unmanned air vehicles), airborne sub-munitions, modular components adapted to be mounted to airborne munitions (e.g., fuse kits), satellites, and certain aircraft. In further embodiments, the multi-purpose mounting device may also be deployed onboard other types of vehicles including, for example, land- and water-based robotic vehicles.

Figure 1:
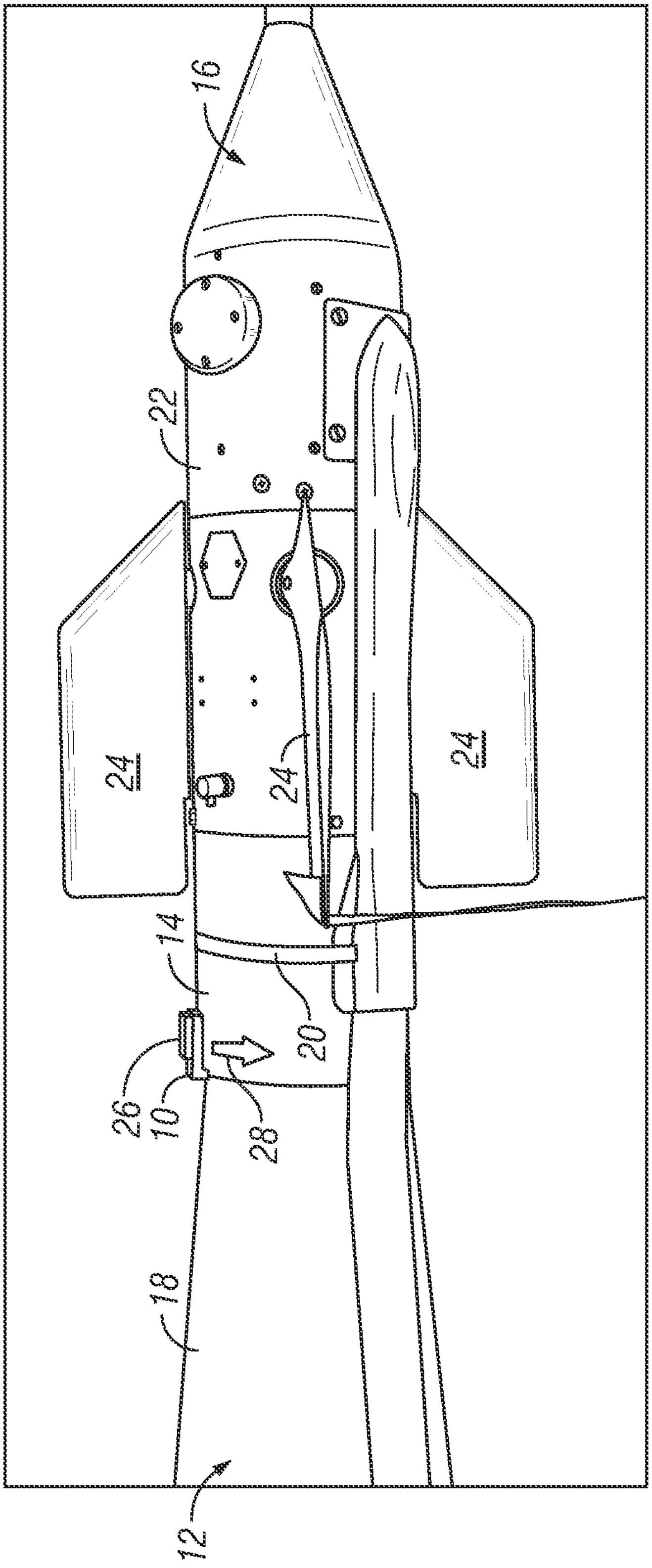
FIG. 1 is an isometric view of a multi-purpose mounting device (MMD) utilized to secure an antenna package to the faring of an airborne munition in accordance with an exemplary embodiment of the present invention.

FIG. 1 is an isometric view of a multi-purpose mounting device (MMD) 10 secured to an external structure of an airborne munition 12 (e.g., a laser guided bomb) in accordance with an exemplary embodiment of the present invention. MMD 10 can be mounted to various types external structures provided on airborne munition 12 or another airborne object. In the exemplary embodiment illustrated in FIG. 1, MMD 10 is secured to a forward adapter or fairing 14, which is attached to a conical housing section or nose 18 of airborne munition 12 utilizing a band clamp 20. A precision guidance kit (PGK) 16 is mounted to the leading or forward end of fairing 14. PGK 16 includes a main body 22 having a plurality of aerodynamic flight guidance surfaces (e.g., canards 24) rotatably coupled thereto. During flight of airborne munition 12, actuators included within PGK 16 manipulate the rotational position of canards 24 in accordance with signals received from one or more onboard guidance systems (e.g., a global positioning system, an inertial navigation system, and/or a laser guidance system) to guide airborne munition 12 to a designated delivery point in a highly accurate manner.

In the exemplary embodiment illustrated in FIG. 1, faring 14 assumes the form of a generally cylindrical body disposed around nose 18 of airborne munition 12. Due to the cylindrical geometry of faring 14 and the conical geometry of nose 18, an annular clearance is provided between the trailing or aft rim of faring 14 and the adjacent conical wall of nose 18. A portion of MMD 10 is installed within this annular clearance and secured in a desired angular or clock position on munition 12 (approximately 12 o'clock in the illustrated example) in the manner described below. After installation on faring 14, MMD 10 is physically captured between the trailing annular edge of fairing 14 and the outwardly sloping wall of munition nose 18. As result, MMD 10 is physically prevented from dislodging from faring 14 and striking an aircraft carrying airborne munition 12 during flight.

MMD 10 enables one more electrical devices to be mounted to airborne munition 12. In addition, MMD 10 enables a wire, cable, or other electrical connector to be routed through MMD 10 in a protected and low strain manner. Any electrical device having appropriate dimensions can be mounted to MMD 10 including, but not limited to, various types of sensors, sensor packages, wireless receivers, wireless transmitters (e.g., radio frequency tracking beacons), and antennas. In the exemplary embodiment illustrated in FIG. 1, specifically, an antenna package 26 is mounted to the exterior of airborne munition 12. Antenna package 26 includes at least one antenna disposed within a ruggedized, puck-shaped casing. By mounting antenna package 26 to the exterior of airborne munition 12, electrical shielding is avoided that would otherwise occur if antenna package 26 were disposed within the metal casing of munition 12.

In certain embodiments, antenna package 26 may be configured to communicate with a transmitter or receiver device located within the host aircraft's cockpit. In such a case, it may be desirable to position MMD 10 such that a direct line-of-sight is provided between antenna package 26 and the aircraft cockpit. MMD 10 enables such a direct line-of-sight to be achieved in two manners. First, by mounting MMD 10 to an external structure (i.e., faring 14) located on a forward section of airborne munition 12, MMD 10 and antenna package 26 are positioned forward of the aircraft wing (not shown). Second, prior to the tightening of a clamping member included within MMD 10 (described below), MMD 10 can slide within the annular clearance provided between fairing 14 and munition nose 18 (indicated in FIG. 1 by arrow 28). A technician can thus install MMD 10 within this annular clearance, slide MMD 10 into a desired angular or clock position, and then secure MMD 10 in the desired clock position utilizing the below-described clamping member. By securing MMD 10 in a desired clock position in this manner, a direct line-of-sight between antenna package 26 and the aircraft cockpit can be provided regardless of particular wing onto which airborne munition 12 is loaded.

Figure 2:
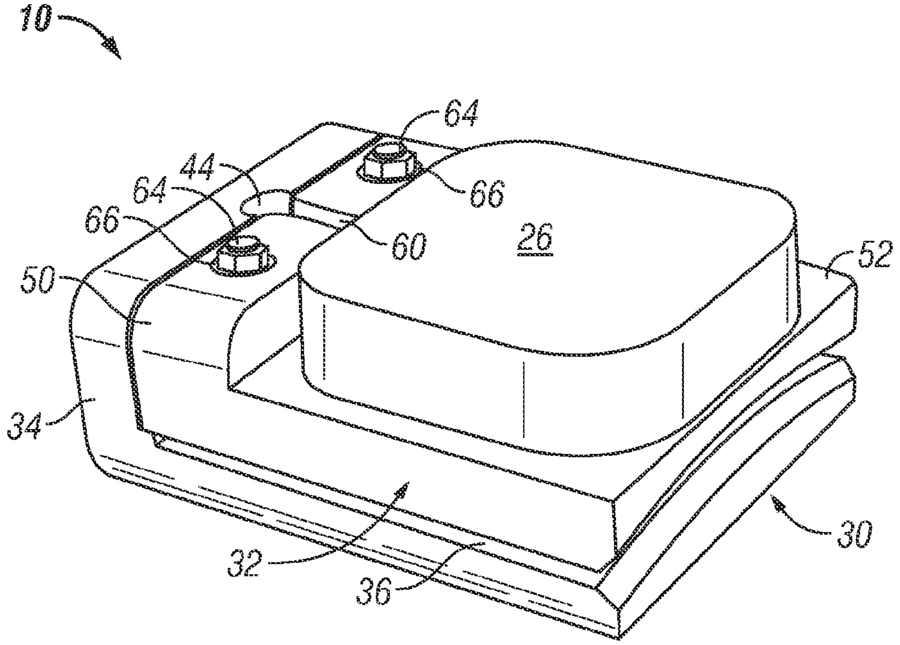
FIG. 2 is an isometric view of the exemplary MMD and antenna package shown in FIG. 1 in an uninstalled state.

FIG. 2 is an isometric view illustrating MMD 10 and antenna package 26 in an uninstalled state. In the illustrated exemplary embodiment, MMD 10 includes three main components: an inner adapter member 30, an outer slide member 32, and a transverse member 34. Adapter member 30 and slide member 32 assume the form of first and second elongated bodies, respectively, with adapter member 30 extending along an axis substantially parallel to the longitudinal axis of slide member 32. Transverse member 34 extends between adjacent ends of slide member 32 and adapter member 30 to form a substantially U-shaped bend proximate the trailing or aft end portion of MMD 10. Transverse member 34 further radially spaces slide member 32 from adapter member 30 to define an open slot 36 within MMD 10. A portion of cylindrical wall of faring 14 is received within open slot 36 when MMD 10 is installed to secure MMD 10 to faring 14 and, therefore, to airborne munition 12. As shown in FIG. 2, open slot 36 is preferably formed to have a generally curved or arcuate geometry to conform with the cylindrical shape of faring 14; however, in alternative embodiments wherein MMD 10 is mounted to a different external structural provided on or coupled to an airborne object, open slot 36 may been provided within a substantially flat geometry, a V-shaped geometry, or other geometry conformal to the particular external structure to which MMD 10 is mounted. The dimensions of open slot 36 and, more generally, of MMD 10 can be scaled to accommodate munitions of varying sizes.

MMD 10 can be produced as a single machined piece, which is fitted onto faring 14 prior to installation onboard airborne munition 12. Alternatively, MMD 10 can be produced as multiple pieces that are subsequently joined together to allow MMD 10 to be fitted onto faring 14 subsequent to installation onboard airborne munition 12. In exemplary embodiment illustrated in FIGS. 1 and 2, adapter member 30 and transverse member 34 are integrally formed as a first machined piece, and slide member 32 is formed as a second machined piece. As a result, a technician can first install faring 14 onboard airborne munition 12, slide adapter member 30 into the annular clearance between faring 14 and nose 18 such that transverse member 34 abuts or is positioned adjacent the trailing or aft edge of faring 14, and subsequently attach slide member 32 to transverse member 34 to retain MMD 10 on airborne munition 12. The technician may then move MMD 10 within the annular clearance to a desired angular or clock position and lock MMD 10 therein by tightening a clamping member against faring 14 as described more fully below. MMD 10 can be fabricated from a variety of different materials including various types of ceramics, composites, and plastics, and is preferably machined from a metal (e.g., titanium) or an alloy (e.g., a steel-based alloy).

Figure 3:
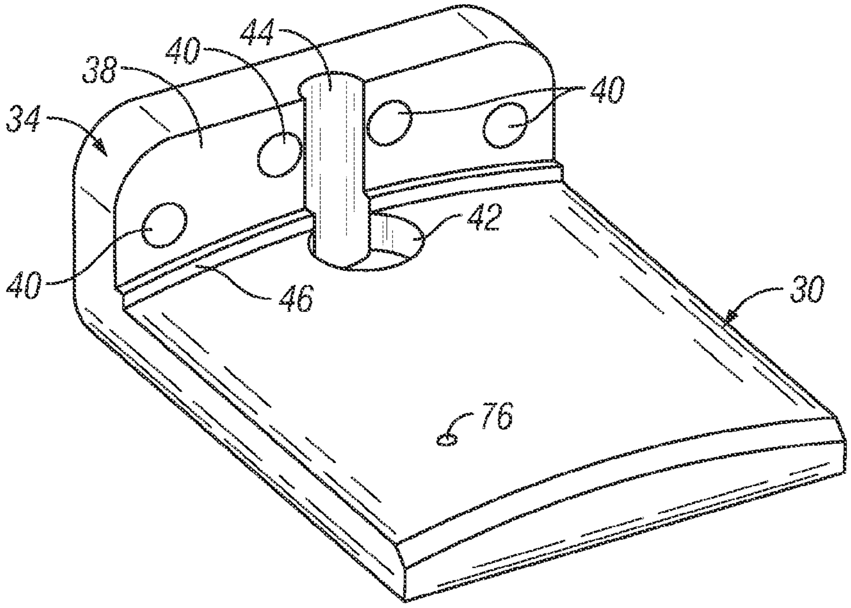
FIGS. 3 and 4 are isometric views of an adapter portion and a slide portion, respectively, included within the exemplary MMD shown in FIGS. 1 and 2.
Figure 4:
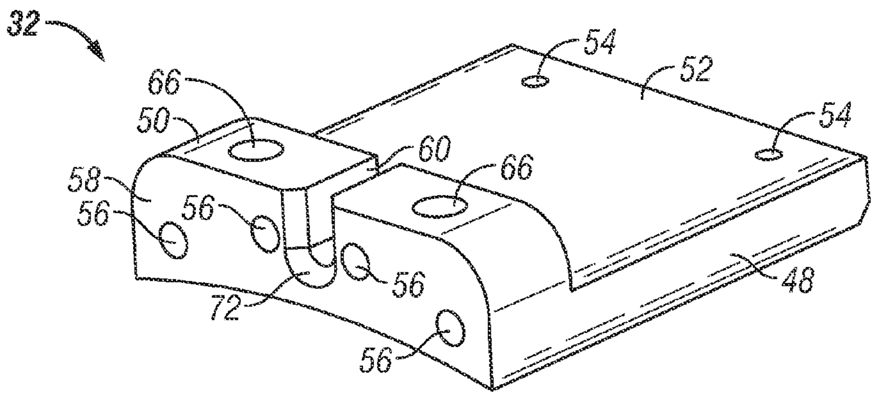

FIG. 3 is an isometric view illustrating adapter member 30 and transverse member 34 in greater detail, and FIG. 4 is an isometric view illustrating slide member 32 in greater detail. With initial reference to FIG. 3, transverse member 34 is integrally joined to an end portion of adapter member 30 such that transverse member 34 and adapter member 30 cooperate to form a substantially L-shaped body. Transverse member 34 includes an outer face (hidden from view in FIG. 3) and an inner face 38. A plurality of fastener apertures 40 extends through transverse member 34 to inner face 38; and a connector aperture 42, 44 is provided through adapter member 30 and transverse member 34. In the exemplary embodiment illustrated in FIG. 3, connector aperture 42, 44 includes an opening 42 formed through adapter member 30 adjacent transverse member 34, and a radial channel 44 formed through transverse member 34 and connecting to opening 42. The inner diameter of radial channel 44 may be less than the inner diameter of opening 42, which is preferably formed to have a width sufficient to permit a connector terminal attached to the end of a wire, cable, or other elongated connector to be threaded therethrough. Finally, one or more alignment features, such an inner step or ledge 46, may be provided to ensure proper radial spacing between adapter member 30 and slide member 32 when MMD 10 is assembled.

Turning now to FIG. 4, slide member 32 includes a main body 48 and a mating end portion 50, which is integrally joined to main body 48 to form a single machined piece having a substantially L-shaped longitudinal profile. An external mounting surface 52 is provided on main body 48 substantially opposite adapter member 30. External mounting surface 52 is configured to support antenna package 26 or other electrical device. As indicated in FIG. 4, external mounting surface 54 is preferably recessed relative to mating end portion 50 to help protect antenna package 26 and any wires, cables, or the connectors associated therewith from high velocity airflow. In contrast to open slot 36 (identified in FIG. 2), external mounting surface 52 preferably has a substantially flat geometry to provide substantially uniform support of antenna package 26. One or more openings 54 may also be formed in mounting surface 52 to help secure antenna package 26 to main body 48 of slide member 32.

With continued reference to FIG. 4, slide member 32 further includes a plurality of fastener apertures 56, which is formed in an outer face 58 of mating end portion 50, and a connector guide channel 60, which is formed through mating end portion 50. When slide member 32 is properly positioned with respect to transverse member 34 (FIGS. 2 and 3), fastener apertures 56 align with fastener apertures 40 (FIG. 3) to receive a plurality of fasteners 62 therethrough (identified in FIG. 5). Fasteners 62 (FIG. 5) thus secure outer face 58 of mating end portion 50 against inner face 38 of transverse member 34 to complete assembly of MMD 10. When MMD 10 is fully assembled in this manner, connector guide channel 60 aligns with connector aperture 42, 44 (identified in FIG. 3) to form a passageway enabling a wire, cable, or other connector to be routed from antenna package 26 to a secondary electrical device disposed within faring 14 or PGK 16 as described more fully below in conjunction with FIG. 5.

As stated above, MMD 10 is preferably equipped with one or more clamping members suitable for locking MMD 10 in a desired angular or clock position on faring 14 (FIG. 1). The clamping member can comprise any structural element or assemblage of structural elements (e.g., one or more cams) configured to selectively exert a clamping force on faring 14 to secure MMD 10 in a desired clock position. In a preferred embodiment, the clamping member assumes the form of one or more set screws. For example, as shown in FIG. 2, MMD 10 may include two set screws 64, which are each threadably disposed within a different aperture 66 formed through mating end portion 50 of slide member 32. Notably, set screws 64 are readily accessible after MMD 10 has been installed within the annular gap provided between faring 14 and nose 18 of airborne munition 12 (FIG. 1); a technician can thus install MMD 10 within the annular gap, slide MMD 10 to a desired clock position, and then lock MMD 10 in the clock position via the tightening of set screws 64. Furthermore, should set screws 64 loosen during flight, MMD 10 is physically captured within the annular clearance between faring 14 and nose 18 (FIG. 1) and consequently cannot dislodged from airborne munition 12 (FIG. 1) during flight.

Figure 5:
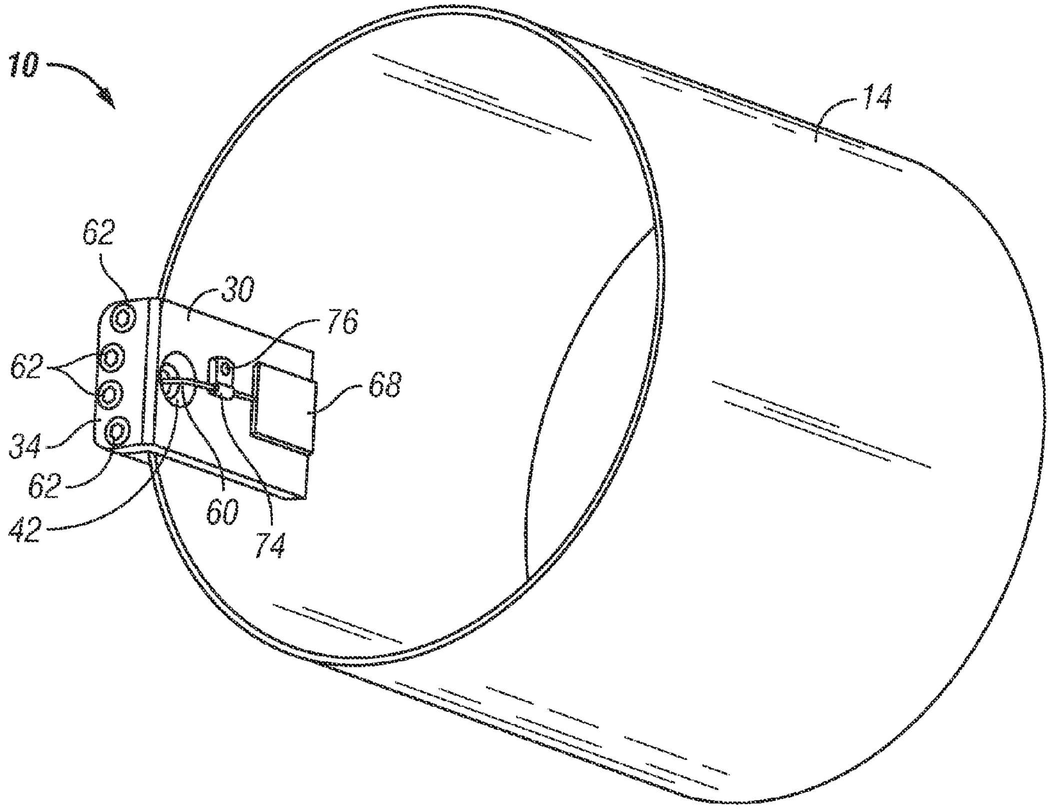
FIG. 5 is a rear isometric view of the exemplary MMD shown in FIGS. 1-4 installed on the annular wall of the munition faring shown in FIG. 1.

FIG. 5 is a rear isometric view of MMD 10 installed on faring 14 and generically illustrating a secondary electrical device 68 to which antenna package 26 (FIG. 2) can be electrically connected utilizing an elongated electrical connector, such as a connector cable 70. Secondary electrical device 68 can comprise a battery, a controller, or any other electrical device that can utilized in conjunction with antenna package 26 and/or another electrical device mounted to external mounting surface 52 provided on slide portion 32 (FIGS. 2 and 4). As shown in FIG. 5, secondary electrical device 68 may be mounted to a substantially flat inner mounting surface provided on adapter member 30 of MMD 10. As indicated in FIG. 5, the edges of opening 42 formed through adapter member 30 are preferably chamfered to help protect cable 70 from physical damage. Similarly, as shown in FIG. 4 at 72, the edges of connector guide channel 60 may also be chamfered to protect cable 70. Connector guide channel 60 (FIGS. 2 and 4) and connector aperture 42, 44 (FIGS. 2 and 3) cooperate to enable connector cable 70 to be routed from antenna package 26 to secondary electrical device 68 in a protected and low strain manner. If desired, a wire routing clip 74 or other guide member can also be attached to the surface of adapter member 30 utilizing a fastener 76 as generally shown in FIG. 5 to further guide and support connector cable 70.

The foregoing has thus provided an exemplary embodiment of a multi-purpose mounting device suitable for securely mounting one or more electrical components (e.g., an antenna package, a sensor package, battery, processor, etc.) to the exterior and/or interior of an airborne munition or other airborne object. Advantageously, in the above-described exemplary embodiment, the mounting device is field installable, all-weather capable, and relatively insensitive to temperature variation; has a relatively low profile to minimize drag when subjected to high velocity airflow; is relatively lightweight; is relatively rugged to withstand extreme loading conditions, high vibratory forces, bird strikes, and soldier handling; is scalable to munitions of different sizes; is generally incapable of disengaging from an airborne munition and striking an aircraft after installation; and enables the routing of wires or other electrical connectors between electrical components in a protected and low strain manner. In addition, the above-described exemplary multi-purpose mounting device is relatively inexpensive and straightforward to manufacture.

In the above-described exemplary embodiment, a first electronic device (i.e., antenna package 26 shown in FIGS. 1 and 2) was mounted to an outer mounting surface provided on slide member 32 of MMD 10, and a second electronic device (i.e., electrical device 68 shown in FIG. 5) was mounted to an inner mounting surface provided on adapter member 30 of MMD 10. This example notwithstanding, electronic devices may be exclusively mounted to slide member 32 or exclusively mounted to adapter member 30 in alternative embodiments. In embodiments wherein one or more electronic devices are mounted to an external mounting surface provided on slide member 32 only, MMD 10 need not include a substantially flat internal mounting surface. Conversely, in embodiments wherein one or more electronic devices are mounted to an internal mounting surface provided on adapter member 30 only, MMD 10 need not include a substantially flat external mounting surface. Although not shown in FIG. 5 for clarity, the electronic device or devices mounted to faring 14 via MMD 10 may be electrically connected to additional circuitry included within PGK 16 (FIG. 1) or contained within airborne munition 12 (FIG. 1) utilizing a wire bundle or connector cable similar to connector cable 60 shown in FIG. 5.

Although described above in conjunction with a particular type of airborne object, (i.e., a laser guided bomb), it is emphasized that embodiments of the multi-purpose mounting device can be utilized in conjunction with a wide variety of airborne objects, including other types of airborne munition (e.g., missiles and unmanned air vehicles), airborne submunitions, modular components adapted to be mounted to airborne munitions (e.g., fuse kits), satellites, land or water based robotic vehicles, and certain aircraft. In further embodiments, the multi-purpose mounting device may also be deployed onboard other types of vehicles including, for example, land- and water-based robotic vehicles. Furthermore, the structural components of the multi-purpose mounting device can vary in disposition, arrangement, dimensions, and shape in alternative embodiments without departing from the scope and spirit of the invention as set-forth in the appended Claims.

The foregoing has also provided an exemplary method for retrofitting an electrical device to an airborne munition or other airborne object having a conical housing section. In one embodiment, the method includes the steps of: (i) disposing a generally cylindrical faring around the conical housing section to form an annular clearance between the conical housing section and the faring, (ii) securing a multi-purpose mounting device having a mounting surface within the annular clearance, and (iii) attaching the electrical device to the mounting surface. The steps can be performed in any desired order. In a further embodiment wherein the multi-purpose mounting device is comprised of an adapter portion, a transverse portion fixedly coupled to the adapter portion, and a slide portion attachable to the transverse portion, the step of securing includes the sub-steps of inserting the adapter portion into the annular clearance such that transverse portion resides adjacent an edge of the faring and attaching the slide portion to the transverse portion utilizing at least one fastener. The angular or clock position of the multi-purpose mounting device may also be adjusted by sliding the device within the annular clearance to a desired clock position on the faring; and, in embodiments wherein the multi-purpose mounting device further includes a clamping member, the multi-purpose mounting may be secured within the desired clock position by tightening the clamping member against the faring.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended Claims.

What is claimed is:

1. A multi-purpose mounting device for mounting a first electrical device to an external structure of an airborne object, the multi-purpose mounting device comprising:

an adapter member;

a slide member coupled to the adapter member and radially spaced apart therefrom to form an open slot, the open slot configured to receive a portion of the external structural therein to secure the multi-purpose mounting device to the external structure of the airborne object; and a first mounting surface provided on one of the adapter member and the slide member and configured to support the first electrical device.

2. The multi-purpose mounting device according to claim 1 wherein the adapter member comprises a first elongated body, and wherein the slide member comprises a second elongated body extending along an axis substantially parallel to the longitudinal axis of the first elongated body.

3. The multi-purpose mounting device according to claim 1 wherein the first mounting surface comprises a substantially flat surface provided on the exterior of the slide member substantially opposite the adapter member.

4. The multi-purpose mounting device according to claim 3 further comprising a transverse member coupled between the adapter member and the slide member.

5. The multi-purpose mounting device according to claim 4 wherein the transverse member is coupled between an end portion of the adapter member and an end portion of the slide member to form a substantially U-shaped bend.

6. The multi-purpose mounting device according to claim 4 wherein the slide member comprises a mating end portion configured to be removably attached to the transverse member.

7. The multi-purpose mounting device according to claim 6 wherein the mating end portion is raised relative to the first mounting surface.

8. The multi-purpose mounting device according to claim 7 wherein the slide member has a substantially L-shaped longitudinal profile.

9. The multi-purpose mounting device according to claim 6 wherein the transverse member and the adapter member are integrally formed.

10. The multi-purpose mounting device according to claim 6 wherein the multi-purpose mounting device is further configured to be utilized with a second electrical device and with an elongated connector electrically coupling the second electrical device to the electrical device, and wherein the multi-purpose mounting device further comprises a connector aperture configured to receive the elongated connector therethrough.

11. The multi-purpose mounting device according to claim 10 wherein the connector aperture is formed at least partially through the adapter member.

12. The multi-purpose mounting device according to claim 11 further comprising a channel formed through the mating portion of slide member and extending between the connector aperture and the first mounting surface.

13. The multi-purpose mounting device according to claim 4 further comprising a clamping member configured to selectively exert a clamping force on the external structure to secure the multi-purpose mounting device in a desired position.

14. The multi-purpose mounting device according to claim 13 wherein the clamping members comprises at least one set screw threadably coupled to the transverse member.

15. The multi-purpose mounting device according to claim 1 wherein the open slot has a substantially arcuate geometry.

16. The multi-purpose mounting device according to claim 1 further comprising a second mounting surface provided on the adapter member substantially opposite the slide member.

17. A method for retrofitting an electrical device to an external structure of an airborne object having a conical housing section, the method comprising the steps of: disposing a generally cylindrical faring around the conical housing section to provide an external structure and to form an annular clearance between the conical housing section and the faring; providing a multi-purpose mounting device having an adapter portion, a transverse portion fixedly coupled to the adapter portion, and a slide portion attachable to the transverse portion wherein the transverse portion spaces the slide portion from the adapter portion to have an annular gap for receiving a portion of the cylindrical fairing; securing the adapter portion of the multi-purpose mounting device within the annular clearance between the conical housing section and the faring; and attaching the slide portion of the multi-purpose mounting device to the transverse portion of the multi-purpose electrical device to encompass a portion of the cylindrical fairing within the annular gap formed between the slide portion and the adapter portion.

18. The method according to claim 17 further comprising:

inserting the adapter portion into the annular clearance to position the transverse portion substantially adjacent an edge of the faring; and attaching the slide portion to the transverse portion utilizing at least one fastener.

19. The method according to claim 17 wherein the multi-purpose mounting device includes a clamping member, and wherein the method further comprises the steps of:

sliding the multi-purpose mounting device within the annular clearance to a desired clock position on the faring; and tightening the clamping member against the faring to secure the multi-purpose mounting device in the desired clock position.

* * * * *